(12) United States Patent
Hendrix et al.

(10) Patent No.: US 10,475,575 B2
(45) Date of Patent: Nov. 12, 2019

(54) IN-SITU OXIDIZED NIO AS ELECTRODE SURFACE FOR HIGH K MIM DEVICE

(71) Applicant: ENTEGRIS, INC., Billerica, MA (US)

(72) Inventors: Bryan C. Hendrix, Danbury, CT (US); Weimin Li, New Milford, CT (US); James Anthony O'Neill, New City, NY (US)

(73) Assignee: ENTEGRIS, INC., Billerica, MA (US)

( * ) Notice: Subject to any disclaimer, the term of this patent is extended or adjusted under 35 U.S.C. 154(b) by 241 days.

(21) Appl. No.: 14/649,334

(22) PCT Filed: Sep. 30, 2013

(86) PCT No.: PCT/US2013/062746
§ 371 (c)(1),
(2) Date: Jun. 3, 2015

(87) PCT Pub. No.: WO2014/088691
PCT Pub. Date: Jun. 12, 2014

(65) Prior Publication Data
US 2015/0318108 A1 Nov. 5, 2015

Related U.S. Application Data
(60) Provisional application No. 61/732,879, filed on Dec. 3, 2012.

(51) Int. Cl.
H01G 4/10 (2006.01)
H01G 4/01 (2006.01)
(Continued)

(52) U.S. Cl.
CPC .............. *H01G 4/10* (2013.01); *C23C 16/44* (2013.01); *C23C 16/45523* (2013.01); *H01G 4/01* (2013.01); *H01L 28/60* (2013.01)

(58) Field of Classification Search
CPC . H01G 4/10; H01G 4/01; H01G 28/60; C23C 16/44; C23C 16/45523
(Continued)

(56) References Cited

U.S. PATENT DOCUMENTS 6,348,705 B1 2/2002 Hendrix
2003/0189241 A1 10/2003 Kamada et al.
(Continued)

FOREIGN PATENT DOCUMENTS

JP 02226122 A * 9/1990
JP 02226122 A * 9/1990
(Continued)

OTHER PUBLICATIONS

Greiner, M., et al., "Effects of Processing Conditions on the Work Function and Energy-Level Alignment of NiO Films", "J. Phys. Chem. C", Nov. 2, 2010, pp. 19777-19781, vol. 114.

Primary Examiner — Michael P McFadden
(74) Attorney, Agent, or Firm — Entegris, Inc.

(57) ABSTRACT

A high dielectric constant metal-insulator structure, including an electrode comprising $NiO_x$ wherein $1 < x \leq 1.5$, and a high k dielectric material in contact with the electrode. The structure may have a further electrode in contact with the high k dielectric material, to form a metal-insulator-metal (MIM) capacitor, e.g., including a bottom electrode comprising $NiO_x$ wherein $1 < x \leq 1.5$, a high k dielectric material overlying the bottom electrode, and a top electrode comprising $NiO_x$ wherein $1 < x \leq 1.5$. The $NiO_x$ electrodes in such applications are oxide-stable, high work function electrodes that avoid deterioration of work function and conductivity during electronic device fabrication involving elevated temperature annealing.

14 Claims, 1 Drawing Sheet

(51) Int. Cl.
*C23C 16/44* (2006.01)
*C23C 16/455* (2006.01)
*H01L 49/02* (2006.01)

(58) Field of Classification Search
USPC .......................................................... 361/305
See application file for complete search history.

(56) References Cited

U.S. PATENT DOCUMENTS

| | | | |
|---|---|---|---|
| 2005/0014352 A1 | 1/2005 | Torii et al. | |
| 2006/0220082 A1* | 10/2006 | Nakamura | H01L 28/57 |
| | | | 257/295 |
| 2007/0082415 A1 | 4/2007 | Jeon et al. | |
| 2008/0199975 A1 | 8/2008 | Park et al. | |
| 2009/0136658 A1 | 5/2009 | Yoshinaka et al. | |
| 2010/0052023 A1* | 3/2010 | Kanaya | H01L 27/11507 |
| | | | 257/295 |
| 2010/0320519 A1* | 12/2010 | Nagai | H01L 27/11509 |
| | | | 257/295 |
| 2011/0033677 A1* | 2/2011 | Shin | B82Y 30/00 |
| | | | 428/201 |
| 2011/0204475 A1* | 8/2011 | Rui | C01G 23/047 |
| | | | 257/532 |
| 2012/0243293 A1* | 9/2012 | Takashima | G11C 11/5685 |
| | | | 365/148 |
| 2012/0287553 A1* | 11/2012 | Ramani | H01G 4/306 |
| | | | 361/301.4 |
| 2014/0287301 A1* | 9/2014 | Yushin | H01M 4/366 |
| | | | 429/188 |
| 2015/0318530 A1* | 11/2015 | Yushin | H01M 4/628 |
| | | | 429/131 |

FOREIGN PATENT DOCUMENTS

| | | |
|---|---|---|
| KR | 1020090052455 A | 5/2009 |
| KR | 1020100123886 A | 11/2010 |
| WO | 2006132107 A1 | 12/2006 |

* cited by examiner

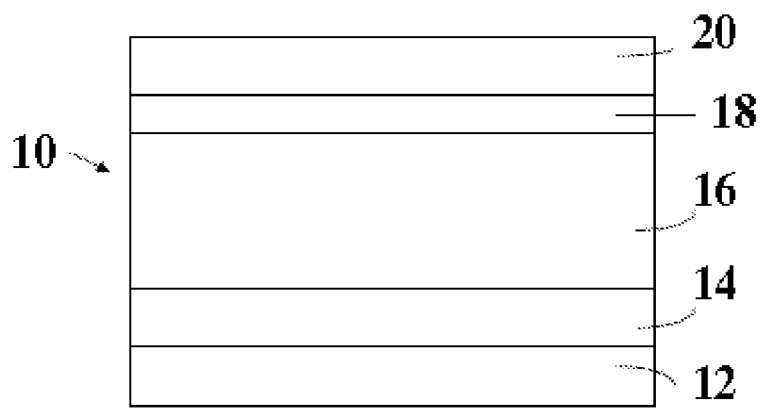

IN-SITU OXIDIZED NIO AS ELECTRODE SURFACE FOR HIGH K MIM DEVICE

CROSS-REFERENCE TO RELATED APPLICATION APPLICATIONS

This application is a U.S. national phase under the provisions of 35 U.S.C. § 371 of International Patent Application No. PCT/US13/62746 filed Sep. 30, 2013, which in turn claims the benefit of priority under 35 USC 119 of U.S. Provisional Patent Application No. 61/732,879 filed Dec. 3, 2012 in the name of Bryan C. Hendrix, et al. for "IN-SITU OXIDIZED NiO AS ELECTRODE SURFACE FOR HIGH k MIM DEVICE". The disclosures of such international patent application and U.S. Provisional Patent Application No. 61/732,879 are hereby incorporated herein by reference, in their respective entireties, for all purposes.

FIELD

The present disclosure relates to high dielectric constant (k) metal-insulator-metal (MIM) electronic devices, and to electrode materials and structures useful in such devices, as well as to methods of making such structures, electrodes, and devices.

DESCRIPTION OF THE RELATED ART

Oxide-stable, high work function electrodes often lose work function or conductivity during processing. $RuO_2$ for example is reduced to Ru metal in a hydrogen-containing environment; $RuO_2$ is oxidized to a volatile $RuO_4$ in an $O_3$-containing environment and the surface is roughened as material leaves the surface. Both environments are common during the processing of MIM capacitors for DRAM and other applications. As another example, $MoO_2$ exhibits a high work function, but when $MoO_2$ comes into contact with most high k oxides, oxygen vacancies will occur in the dielectric as minor amounts of $MoO_3$ are formed. The result of this oxygen depletion is that the dielectric will become an n-type conductor.

Accordingly, the art continues to seek improved oxide-stable, high work function electrode materials and formation techniques that avoid such deterioration of work function and conductivity during electronic device fabrication.

SUMMARY

The present disclosure relates to high dielectric constant (k) metal-insulator-metal (MIM) electronic devices, and to electrode materials and structures useful in such devices, as well as to methods of making such electrodes and devices.

In one aspect, the disclosure relates to a high dielectric constant metal-insulator structure, comprising:
an electrode comprising $NiO_x$ wherein $1<x\leq1.5$; and
a high k dielectric material in contact with the electrode.

In a further aspect, the disclosure relates to a dielectric and conductive material structure, comprising high k dielectric material in contact with conductive material comprising $NiO_x$ wherein $1<x\leq1.5$.

In another aspect, the disclosure relates to a metal-insulator-metal capacitor, comprising:
a bottom electrode comprising $NiO_x$ wherein $1<x\leq1.5$;
a high k dielectric material overlying the bottom electrode; and
a top electrode comprising $NiO_x$ wherein $1<x\leq1.5$.

An additional aspect of the disclosure relates to a method of forming a high dielectric constant metal-insulator structure, comprising:
forming one of an electrode and a high k dielectric material; and
depositing thereon the other of said electrode and high k dielectric material, to form a high dielectric constant metal-insulator structure,
wherein the electrode comprises $NiO_x$ wherein $1<x\leq1.5$.

In a further aspect, the disclosure relates to a method of forming a metal-insulator-metal capacitor on a substrate, comprising:
depositing on the substrate a bottom electrode comprising $NiO_x$, wherein $1<x\leq1.5$; depositing high k dielectric material on the bottom electrode; and
depositing on the high k dielectric material a top electrode comprising $NiO_x$, wherein $1<x\leq1.5$.

Other aspects, features and embodiments of the invention will be more fully apparent from the ensuing description and appended claims.

BRIEF DESCRIPTION OF THE DRAWINGS

FIG. 1 is a schematic illustration of a MIM capacitor 10 according to one embodiment of the present disclosure

DETAILED DESCRIPTION

The present disclosure relates to high dielectric constant (k) metal-insulator-metal (MIM) electronic devices, and to electrode materials and structures useful in such devices, as well as to methods of making such structures, electrodes, and devices.

As used herein, the term "film" refers to a layer of deposited material having a thickness below 1000 micrometers, e.g., from such value down to atomic monolayer thickness values. In various embodiments, film thicknesses of deposited material layers in the practice of the invention may for example be below 100, 10, or 1 micrometers, or in various thin film regimes below 200, 20, or 5 nanometers, down to 1 nm, depending on the specific application involved. In specific thin film embodiments, the film thickness may be in a range of from 2 to 15 nm. As used herein, the term "thin film" means a layer of a material having a thickness below 1 micrometer.

As used herein and in the appended claims, the singular forms "a", "and", and "the" include plural referents unless the context clearly dictates otherwise.

The disclosure, as variously set out herein in respect of features, aspects and embodiments thereof, may in particular implementations be constituted as comprising, consisting, or consisting essentially of, some or all of such features, aspects and embodiments, as well as elements and components thereof being aggregated to constitute various further implementations of the disclosure. The disclosure is described herein in various embodiments, and with reference to various features and aspects. The disclosure contemplates such features, aspects and embodiments in various permutations and combinations, as being within the scope of the present description.

The present disclosure is based on the finding that $NiO_x$, wherein $1<x\leq1.5$, can be used as an oxide-stable, high work function material for forming conductive electrodes in electronic devices, e.g., as formed in situ with high k dielectric materials ($k\geq8$). Dielectric materials of varied types, having k value in a range of from 8 to 24,700, as measured at 25° C., may be utilized in such electronic devices.

The disclosure relates in one aspect to a high dielectric constant metal-insulator structure, comprising:

an electrode comprising $NiO_x$ wherein $1<x\leq1.5$; and a high k dielectric material in contact with the electrode.

The high k dielectric material in such structure may have a dielectric constant, k, in a range of from 8 to 24,700. The high k dielectric material may be of any suitable type, and may for example comprise material selected from the group consisting of $Al_2O_3$, $Ta_2O_3$, Bi—Ta—O, Bi—Nb—O, $PbMgNbO_3+PbTiO_3$, $PbLaZrTiO_3$, $BaSrTiO_3$, $(Ba,Sr)Ti_4O_9$, Ti—Zr—Sn—O, $Ta_2O_5$, lanthanide-(Ta,Nb)—O, Al—Ta—O, $HfO_2$, $ZrO_2$, doped $HfO_2$, and doped $ZrO_2$.

The high dielectric constant metal-insulator structure described above may be disposed on a substrate, such as a substrate comprising material selected from the group consisting of Si, $SiO_2$, sapphire, alumina, diamond, graphene, and TiN.

In various embodiments, the high k dielectric material may be in contact with a second electrode, which may be the same as, or different from, the electrode comprising $NiO_x$.

In another aspect, the disclosure relates to a MIM (metal-insulator-metal) capacitor, comprising: (i) a bottom electrode comprising $NiO_x$, wherein $1<x\leq1.5$; (ii) high k ($k\geq8$) dielectric material overlying the bottom electrode; and (iii) a top electrode comprising $NiO_x$, wherein $1<x\leq1.5$, overlying the high k dielectric material.

Such MIM capacitor may further comprise a cap overlying the top electrode, e.g., a cap formed of alumina.

A further aspect of the disclosure relates to a dielectric and conductive material structure, comprising high k dielectric material in contact with conductive material comprising $NiO_x$ wherein $1<x\leq1.5$. The high k dielectric material in such structure may have a dielectric constant, k, in a range of from 8 to 24,700, and may for example comprise material selected from the group consisting of $Al_2O_3$, $Ta_2O_3$, Bi—Ta—O, Bi—Nb—O, $PbMgNbO_3+PbTiO_3$, $PbLaZrTiO_3$, $BaSrTiO_3$, $(Ba,Sr)Ti_4O_9$, Ti—Zr—Sn—O, $Ta_2O_5$, lanthanide-(Ta,Nb)—O, Al—Ta—O, $HfO_2$, $ZrO_2$, doped $HfO_2$, and doped $ZrO_2$.

The disclosure relates in still another aspect to a method of forming a high dielectric constant metal-insulator structure, comprising:

$[(C_6H_5)_3P]_2Ni$, and $Ni(OCC(CH_3)_3CHCOC(CH_3)_3)_2$. The vapor deposition process may comprise an oxidizing environment including an oxidizing agent selected from the group consisting of oxygen, ozone, hydrogen peroxide, and oxygen plasma.

The above-described method may be carried out with a high k dielectric material comprising material having a dielectric constant, k, in a range of from 8 to 24,700. The high k dielectric material may comprise material selected from the group consisting of $Al_2O_3$, $Ta_2O_3$, Bi—Ta—O, Bi—Nb—O, $PbMgNbO_3+PbTiO_3$, $PbLaZrTiO_3$, $BaSrTiO_3$, $(Ba,Sr)Ti_4O_9$, Ti—Zr—Sn—O, $Ta_2O_5$, lanthanide-(Ta,Nb)—O, Al—Ta—O, $HfO_2$, $ZrO_2$, doped $HfO_2$, and doped $ZrO_2$.

In the above-described method, a second electrode may be provided in contact with the high k dielectric material. The electrodes may thereby comprise a bottom electrode and a top electrode. The method may further comprise depositing on the top electrode a capping layer, of a suitable material such as alumina, e.g., by vapor deposition thereof using a trimethylaluminum precursor and ozone as an oxidizing agent.

In another aspect, the disclosure relates to a method of fabrication of a MIM (metal-insulator-metal) capacitor on a substrate, comprising: depositing a bottom electrode comprising $NiO_x$, wherein $1<x\leq1.5$, on the substrate; depositing high k ($k\geq8$) dielectric material on the bottom electrode; and depositing a top electrode comprising $NiO_x$, wherein $x\geq1$, on the high k dielectric material.

The MIM devices of the present disclosure may be formed on any suitable substrates. Illustrative substrate materials include, without limitation, Si, $SiO_2$, sapphire, alumina, diamond, graphene, and TiN.

The deposition of $NiO_x$ in the above-described method can be carried out by any suitable deposition process, e.g., a vapor deposition process such as chemical vapor deposition (CVD), atomic layer deposition (ALD), pulsed chemical vapor deposition, or the like. ALD is particularly preferred for applications such as formation of MIM capacitors on high aspect ratio structures. Useful nickel precursors for vapor deposition of nickel to form $NiO_x$ films in the broad practice of the disclosure include, without limitation,

| Precursor | Formula |
|---|---|
| Bis(cyclopentadienyl)nickel(II) | $Ni(C_5H_5)_2$ |
| Bis(ethylcyclopentadienyl)nickel(II) | $Ni(C_5H_4C_2H_5)_2$ |
| Bis(triphenylphosphine)nickel(II) | $[(C_6H_5)_3P]_2Ni$ |
| Nickel(II)bis(2,2,6,6-tetramethyl-3,5-heptanedionate) | $Ni(OCC(CH_3)_3CHCOC(CH_3)_3)_2$ | forming one of an electrode and a high k dielectric material; and depositing thereon the other of said electrode and high k dielectric material, to form a high dielectric constant metal-insulator structure, wherein the electrode comprises $NiO_x$ wherein $1<x\leq1.5$.

In such method, the high dielectric constant metal-insulator structure may be formed on a substrate, e.g., a substrate comprising a material selected from the group consisting of Si, $SiO_2$, sapphire, alumina, diamond, graphene, and TiN.

The method may entail forming the $NiO_x$ by deposition thereof in a vapor deposition process, such as chemical vapor deposition, atomic layer deposition, or pulsed chemical vapor deposition. $NiO_x$ may be deposited in the vapor deposition process from vapor of a nickel precursor selected from the group consisting of $Ni(C_5H_5)_2$, $Ni(C_5H_4C_2H_5)_2$, In such vapor deposition processes, oxidizing environments and oxidizing agents such as oxygen, ozone, hydrogen peroxide, oxygen plasma, etc. can be used to provide and increase the oxidation state of the $NiO_x$, wherein $x>1$.

In applications in which the highly oxidated $NiO_x$ ($x>1$) is employed to form microelectronic devices in which dielectric materials are contiguous or in close proximity to the highly oxidated $NiO_x$, the dielectric material is desirably of a high k, low leakage character, e.g., in an as-deposited or generally amorphous condition. Examples of dielectric materials that may be usefully employed in such respect include, without limitation, $Al_2O_3$, $Ta_2O_3$, Bi—Ta—O, Bi—Nb—O, $PbMgNbO_3+PbTiO_3$, $PbLaZrTiO_3$, $BaSrTiO_3$, $(Ba,Sr)Ti_4O_9$, Ti—Zr—Sn—O, $Ta_2O_5$, lanthanide-(Ta,Nb)—O, Al—Ta—O, $Hf_2$, $ZrO_2$, doped $HfO_2$, and doped $ZrO_2$. In general, dielectric materials having k values in a range of from 8 to 24,700 may be employed. Further examples of dielectrics usefully employed in the broad practice of the present disclosure include, without limitation, the dielectric materials described in U.S. Pat. No. 6,348,705 issued Feb. 19, 2002 to Bryan C. Hendrix, the disclosure of which is hereby incorporated herein by reference, as well as non-crystalline tetratitanate dielectrics. In general, dielectrics with non-crystalline or crystalline ordering can be used. The high work function electrode is especially useful as the bandgap of the dielectric decreases.

In various embodiments, the MIM capacitor devices of the disclosure after fabrication thereof may be capped with a protective alumina layer, e.g., by vapor deposition of alumina ($Al_2O_3$) over the MIM device. Such capping operation may be carried out using a precursor such as trimethylaluminum (TMA) that is volatilized to form TMA vapor. The TMA vapor may be contacted with the MIM structure in an oxic environment, e.g., in a TMA/$O_3$ mixture. Capping in this manner will serve to protect the MIM device structure from deoxygenation and other adverse processing effects incident to gas anneals, e.g., in an annealing ambient of inert or reducing gas comprising argon, nitrogen, helium, hydrogen, carbon monoxide, etc.

Referring now to the drawing, FIG. 1 is a schematic illustration of a MIM capacitor 10 according to one embodiment of the present disclosure. The MIM capacitor is formed on a suitable substrate 12, and includes $NiO_x$ bottom electrode 14, dielectric material 16, and $NiO_x$ top electrode 18, and optional cap 20. The dielectric material 16 can be of any suitable type, and may include any of $Al_2O_3$, $Ta_2O_3$, Bi—Ta—O, Bi—Nb—O, $PbMgNbO_3+PbTiO_3$, $PbLaZrTiO_3$, $BaSrTiO_3$, $(Ba,Sr)Ti_4O_9$, Ti—Zr—Sn—O, $Ta_2O_5$, lanthanide-(Ta,Nb)—O, Al—Ta—O, $HfO_2$, $ZrO_2$, doped $HfO_2$, and doped $ZrO_2$. The cap 20 may be formed of alumina ($Al_2O_3$) or other suitable capping material that protects the MIM capacitor during annealing of the device structure including the MIM capacitor, e.g., at annealing temperatures in a range of from 250° C. to 1200° C.

While the disclosure has been set out herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the invention as hereinafter claimed is intended to be broadly construed and interpreted, as including all such variations, modifications and alternative embodiments, within its spirit and scope.

What is claimed is:

1. A high dielectric constant metal-insulator structure, comprising:
   an electrode comprising $NiO_x$ wherein $1<x<1.5$;
   a high k dielectric material in contact with the electrode, the high k dielectric material comprising a material selected from the group consisting of $Al_2O_3$, $Ta_2O_3$, Bi—Ta—O, Bi—Nb—O, $PbMgNbO_3+PbTiO_3$, $PbLaZrTiO_3$, $BaSrTiO_3$, $(Ba,Sr)Ti_4O_9$, Ti—Zr—Sn—O, $Ta_2O_5$, lanthanide-(Ta,Nb)—O, Al—Ta—O, $HfO_2$, $ZrO_2$, doped $HfO_2$, and doped $ZrO_2$; and
   a protective cap in direct contact with the electrode, wherein the protective cap is a vapor deposition layer that protects the high dielectric constant metal-insulator structure from deoxygenation or adverse processing effects incident to gas anneals.

2. The high dielectric constant metal-insulator structure of claim 1, wherein the high k dielectric material has a dielectric constant, k, in a range of from 8 to 24,700.

3. The high dielectric constant metal-insulator structure of claim 1, disposed on a substrate.

4. The high dielectric constant metal-insulator structure of claim 3, wherein the substrate comprises a material selected from the group consisting of Si, $SiO_2$, sapphire, alumina, diamond, graphene, and TiN.

5. The high dielectric constant metal-insulator structure of claim 1, wherein the high k dielectric material is in contact with a second electrode.

6. A metal-insulator-metal capacitor, comprising:
   a bottom electrode comprising $NiO_x$ wherein $1<x<1.5$;
   a high k dielectric material in contact with the bottom electrode, the high k dielectric material comprising a material selected from the group consisting of $Al_2O_3$, $Ta_2O_3$, Bi—Ta—O, Bi—Nb—O, $PbMgNbO_3+PbTiO_3$, $PbLaZrTiO_3$, $BaSrTiO_3$, $(Ba,Sr)Ti_4O_9$, Ti—Zr—Sn—O, $Ta_2O_5$, lanthanide-(Ta,Nb)—O, Al—Ta—O, $HfO_2$, $ZrO_2$, doped $HfO_2$, and doped $ZrO_2$;
   a top electrode comprising $NiO_x$ in contact with the high k dielectric material, wherein $1<x<1.5$; and
   a protective cap overlying and in direct contact with the top electrode, wherein the protective cap is a vapor deposition layer that protects the capacitor from deoxygenation or adverse processing effects incident to gas anneals.

7. The metal-insulator-metal capacitor of claim 6, wherein the protective cap comprises alumina.

8. A dielectric and conductive material structure, comprising high k dielectric material in contact with conductive material comprising $NiO_x$ wherein $1<x<1.5$, the high k dielectric material comprising a material selected from the group consisting of $Al_2O_3$, $Ta_2O_3$, Bi—Ta—O, Bi—Nb—O, $PbMgNbO_3+PbTiO_3$, $PbLaZrTiO_3$, $BaSrTiO_3$, $(Ba,Sr)Ti_4O_9$, Ti—Zr—Sn—O, $Ta_2O_5$, lanthanide-(Ta,Nb)—O, Al—Ta—O, $HfO_2$, $ZrO_2$, doped $HfO_2$, and doped $ZrO_2$, wherein the structure further comprises a protective cap in direct contact with the structure, wherein the protective cap is a vapor deposition layer that protects the structure from deoxygenation or adverse processing effects incident to gas anneals.

9. The dielectric and conductive material structure of claim 8, wherein the high k dielectric material has a dielectric constant, k, in a range of from 8 to 24,700.

10. A method of forming a high dielectric constant metal-insulator structure, comprising:
    forming one of an electrode and a high k dielectric material, the high k dielectric material comprising a material selected from the group consisting of $Al_2O_3$, $Ta_2O_3$, Bi—Ta—O, Bi—Nb—O, $PbMgNbO_3+PbTiO_3$, $PbLaZrTiO_3$, $BaSrTiO_3$, $(Ba,Sr)Ti_4O_9$, Ti—Zr—Sn—O, $Ta_2O_5$, lanthanide-(Ta,Nb)—O, Al—Ta—O, $HfO_2$, $ZrO_2$, doped $HfO_2$, and doped $ZrO_2$;
    depositing thereon the other of said electrode and high k dielectric material, to form a high dielectric constant metal-insulator structure, wherein the electrode comprises $NiO_x$ wherein $1<x<1.5$;
    forming a second electrode, in contact with said high k dielectric material, wherein the electrodes comprise a bottom electrode and a top electrode, and
    depositing a protective capping layer, in direct contact with the top electrode, wherein the protective cap is a vapor deposition layer that protects the high dielectric constant metal-insulator structure from deoxygenation or adverse processing effects incident to gas anneals.

11. The method of claim 10, wherein the high dielectric constant metal-insulator structure is formed on a substrate, wherein the substrate comprises a material selected from the group consisting of Si, $SiO_2$, sapphire, alumina, diamond, graphene, and TiN.

12. The method of claim 10, wherein $NiO_x$ is deposited in a vapor deposition process, wherein the vapor deposition process comprises a process selected from the group consisting of chemical vapor deposition, atomic layer deposition, and pulsed chemical vapor deposition.

13. The method of claim 12, wherein $NiO_x$ is deposited in the vapor deposition process from vapor of a nickel precursor selected from the group consisting of $Ni(C_5H_5)_2$, $Ni(C_5H_4C_2H_5)_2$, $[(C_6H_5)_3P]_2Ni$, and $Ni(OCC(CH_3)_3CHCOC(CH_3)_3)_2$.

14. The method of claim 10, further comprising annealing the metal-insulator-metal capacitor.

* * * * *